United States Patent [19]

Chen

[11] Patent Number: 5,731,625
[45] Date of Patent: Mar. 24, 1998

[54] BIPOLAR VARIABLE RESISTANCE DEVICE

[75] Inventor: Han-Ping Chen, Pingtung, Taiwan

[73] Assignee: United Microelectronics Corporation, Taiwan

[21] Appl. No.: 766,771

[22] Filed: Dec. 13, 1996

[30] Foreign Application Priority Data

Jun. 26, 1996 [TW] Taiwan ............................ 85107687

[51] Int. Cl.[6] .................................................. H01L 27/04
[52] U.S. Cl. ........................... 257/565; 257/516; 257/517; 257/904
[58] Field of Search ............................ 257/517, 516, 257/519, 532, 660, 197, 559, 627, 563, 592, 565, 904; 326/65, 58, 83; 438/475, 520, 796, 919

[56] References Cited

U.S. PATENT DOCUMENTS

| 4,678,940 | 7/1987 | Vasseghi et al. | 257/565 |
| 4,746,623 | 5/1988 | Lane | 437/27 |
| 4,775,882 | 10/1988 | Miller et al. | 257/519 |
| 4,937,648 | 6/1990 | Huang | 257/565 |

*Primary Examiner*—Carl W. Whitehead
*Attorney, Agent, or Firm*—Rabin, Champagne & Lynt, P.C.

[57] ABSTRACT

A bipolar variable resistance device suitable for integrated circuit applications includes a silicon substrate, and a resistive layer covering the silicon substrate, the resistive layer being doped with impurities of a first polarity and of a second polarity. A dielectric layer covers the resistive layer. A conductive layer covers the dielectric layer. The device is used to change the resistance of the resistive layer by varying a control voltage applied to the conductive layer.

10 Claims, 3 Drawing Sheets

BIPOLAR VARIABLE RESISTANCE DEVICE

BACKGROUND OF THE INVENTION

1. Field of the Invention

The invention relates in general to a resistance device used in an integrated circuit, and more particularly to a resistance device in an integrated circuit, whose resistance can be varied.

2. Description of the Related Art

Resistance is one of the most basic components of electronic circuitry, and its importance hardly needs any explanation. However, in incorporating a resistive device into an integrated circuit, a large amount of surface area is often required, and therefore the process of manufacturing a resistive device involves a lot of expertise. In some IC applications, a resistive component is not only required, but also is preferably variable in resistance value and controllable so as to, for example, lower power loss and increase operational speed.

The use and operation of such resistive components in a conventional static RAM cell is discussed below with reference to FIG. 1, which shows a circuit diagram of a conventional static RAM cell. Referring to FIG. 1, a conventional static RAM cell consists of a first resistor (or reactance component) R1, a second resistor (or reactance component) R2, a first MOS transistor T1, a second MOS transistor T2, a third MOS transistor T3 and a fourth MOS transistor T4. Of the above components, the first resistor R1 and the first MOS transistor T1, as well as the second resistor R2 and the second MOS transistor T2, are connected in series between first and second voltage sources (for example, between voltage source (VDD) and ground (VSS)). The gate of the first MOS transistor T1 is connected to a second node point B, while the gate of the second MOS transistor T2 is connected to a first node point A. Furthermore, two terminals of the third MOS transistor T3 couple the first bit line (BL) with node point A, while its gate terminal is connected to the word line (WL). Similarly, two terminals of the fourth MOS transistor T4 couple the second bit line (BL) with the node point B, while its gate terminal is connected to the same word line (WL).

When the static RAM is in a 'write' state, the third MOS transistor T3 and the fourth MOS transistor T4 conduct. If an input bit of '1' is placed on the first bit line (BL), the first node point A reaches a high voltage potential (VDD), making the second MOS transistor T2 conduct. This leads to a low voltage potential (VSS) at the node point B, so that the first MOS transistor T1 is cut off, maintaining the first node point A at the high voltage potential. On the contrary, when an input bit of '0' is placed on the first bit line (BL), the first node point A drops to a low voltage potential (VSS), cutting off the second MOS transistor T2. This raises the second node point B to a high voltage potential (VDD), so that the first MOS transistor T1 conducts and the low voltage potential at the first node point A is maintained.

When the static RAM cell is neither in the 'write' state nor the 'read' state, the third MOS transistor T3 and the fourth MOS transistor T4 are both cut off, and the voltage potential at node point A is maintained according to the states of the first MOS transistor T1 and the second MOS transistor T2.

It is apparent from the above that the first resistor R1 and the second resistor R2 play the roles of load resistors. Therefore, when the static RAM cell is neither in the 'write' state nor the 'read' state, the resistance of the first resistor R1 and the second resistor R2 should be as high as possible in order to reduce load currents and minimize energy losses. And when the situation is reversed, it is preferable to have the resistance of the first resistor R1 and the second resistor R2 as small as possible in order to reduce the charging time for resistor/capacitor circuits and increase operational speeds.

SUMMARY OF THE INVENTION

It is therefore an object of this invention to provide a bipolar variable resistance device which utilizes a voltage level controlling input to change its resistance either up or down.

To achieve the above and related objects of the invention, a bipolar variable resistance device according to the invention and useful in integrated circuit applications is provided, which includes a silicon substrate and a resistive layer covering the silicon substrate, the resistive layer being doped with a first polarity impurity and a second polarity impurity. A dielectric layer covers the resistive layer, and a conductive layer covers the dielectric layer. Varying the control voltage applied to the conductive layer has the effect of changing the resistance of the resistive layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Figure 2A:
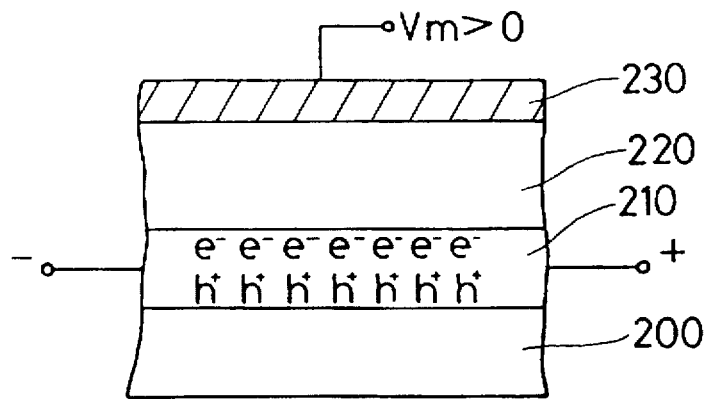
FIGS. 2A to 2B are diagrams showing the theory of operation for a bipolar variable resistance device according to the invention.
Figure 2B:
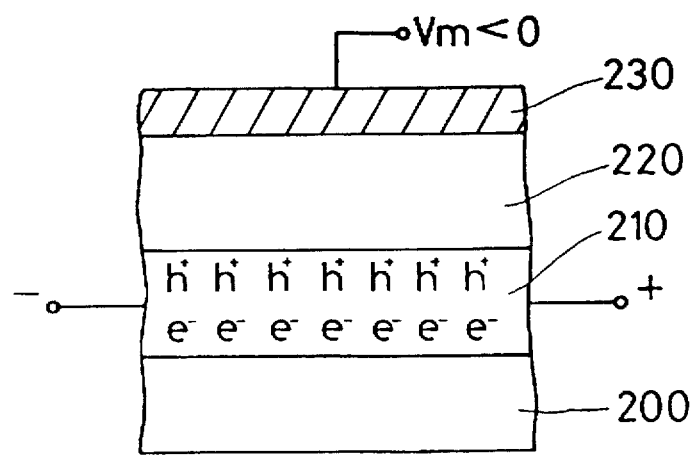

FIGS. 2A to 2B are diagrams showing the basis of operation for a bipolar variable resistance device according to this invention. The bipolar variable resistance device comprises a silicon substrate layer 200, a resistive layer 210 covering the top of the silicon substrate 200, a dielectric layer 220 covering the resistive layer 210, and a conductive layer 230 covering the dielectric layer 220. The resistive layer is doped with a first polarity impurity and a second polarity impurity.

Referring to FIG. 2A, the resistive layer 210 is doped with a large quantity of first polarity (N-type) impurities and second polarity (P-type) impurities. As a result, electrons provided by the N-type impurities and holes provided by the P-type impurity mutually recombine, so that when a control voltage applied to an input Vm is 0V, the resistance between the positive node point and the negative node point is at its greatest value. When the control voltage applied to the input Vm is greater than 0V, an electric field effect causes the electrons to be attracted upwards while the holes are repelled downwards, thus lowering the probability of recombination between electron-hole pairs. This leads to an increase in the number of both carriers available, and as a result, the resistance between the positive node point and the negative node point decreases when the control voltage at the input Vm is increased.

Referring to FIG. 2B, when the control voltage applied to the input Vm is less than 0V, the electric field effect causes the electrons to be repelled downwards and the holes to be attracted upwards, thus lowering the chance of electron-hole pairs recombination. This again leads to an increase in the number of both carriers available, and as a result, the resistance between the positive node point and the negative node point decreases when the controlling voltage at the input Vm is decreased.

Figure 3A:
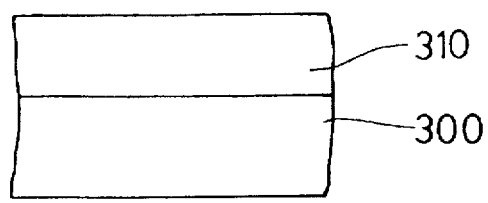
FIGS. 3A to 3D are cross-sectional views showing the process of fabricating a bipolar variable resistance device according to one preferred embodiment of the invention.

FIGS. 3A to 3D are cross-sectional views showing the process of fabricating a bipolar variable resistance device according to a preferred embodiment of the invention. Referring to FIG. 3A, first a layer of undoped, pure silicon, namely the resistive layer 310, is deposited so as to cover a silicon substrate 300 therebelow. The thickness of this resistive layer 310 in general is about 800 Å.

Figure 3B:
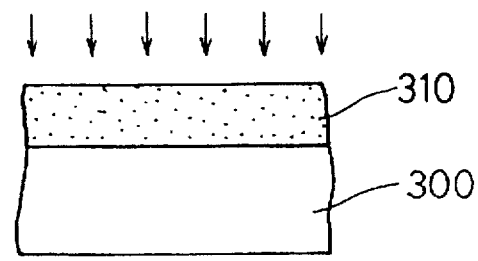

Referring to FIG. 3B, impurities are implanted in the resistive layer such that both a first polarity impurity and a second polarity impurity are included within the layer. For example, an N-type impurity such as phosphorus ions are implanted with an energy of 35 Kev and so as to provide a dosage of $3 \times 10^{13}$ atoms/cm$^2$, and then a P-type impurity such as boron ions are implanted with an energy of 35 KeV and so as to provide a dosage of $5 \times 10^{13}$ atoms/cm$^2$. Since the energies at which the P-type and the N-type impurities are implanted are similar, the spread of the dopant concentration has a normal distribution with a peak concentration around the mid-line depth of the resistive layer and with a tapering off up and down towards the edges of the resistive layer.

Figure 3C:
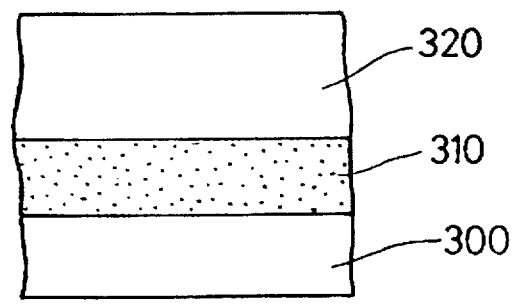

Referring to FIG. 3C, a dielectric layer 320 is deposited so as to cover the resistive layer 310. A simple example of a suitable dielectric layer 320 is an oxide insulating layer with a thickness of about 3000 Å.

Figure 3D:
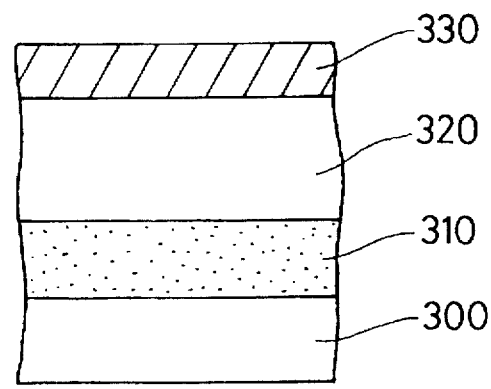

Lastly, referring to FIG. 3D, a conductive layer 330 is deposited so as to cover the dielectric layer 320. The conductive layer 330 can be either metallic or a highly doped polysilicon. According to the theory of the invention as described above, by varying the voltage of conductive layer 330, the resistance value of the resistive layer 310 can be changed.

Figure 1:
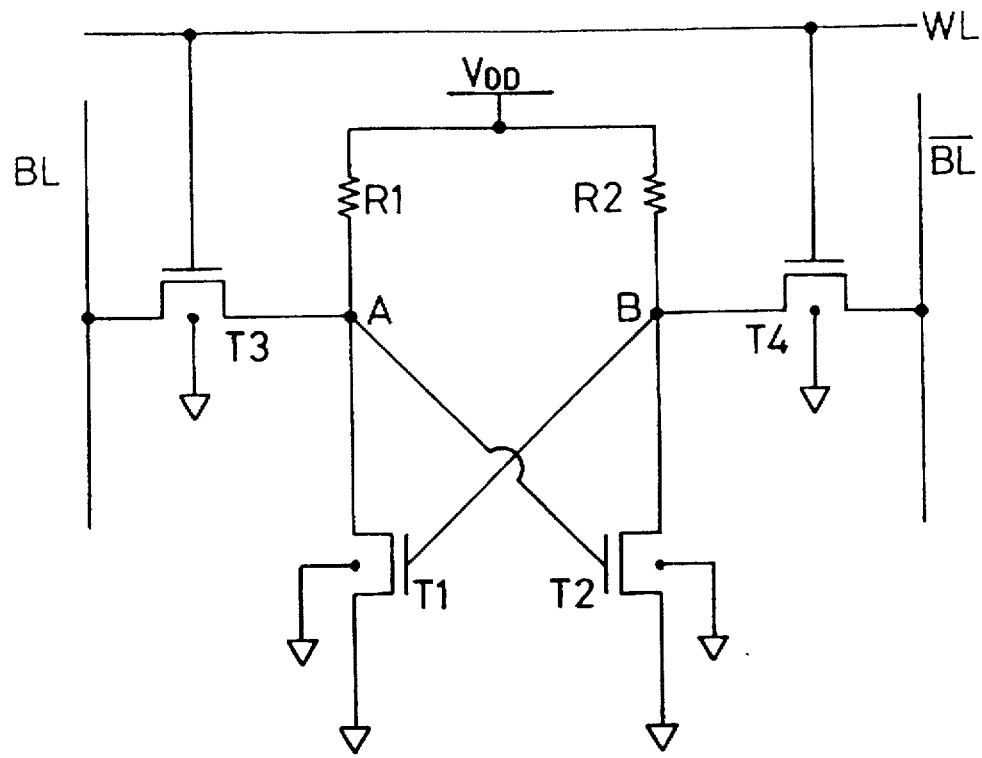
FIG. 1 is a circuit diagram for a conventional static RAM cell.
Figure 4:
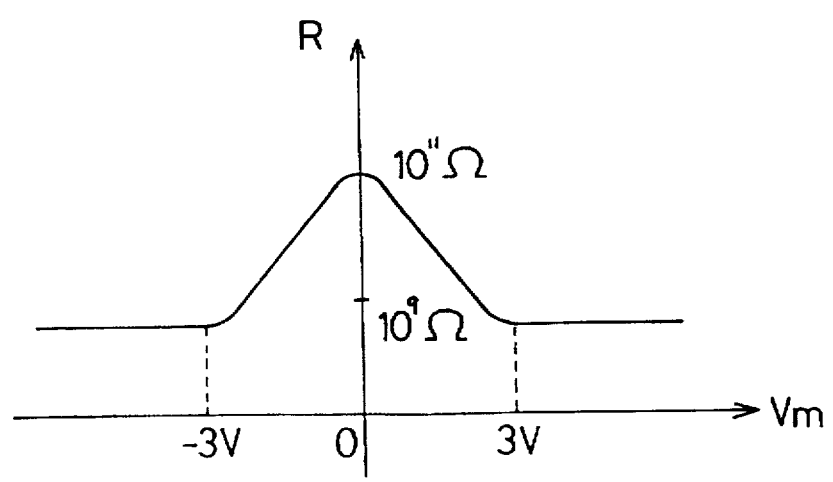
FIG. 4 shows a relationship between the control voltage and the resistance of a bipolar variable resistance device according to the preferred embodiment of the invention.

FIG. 4 shows the relationship between the control voltage and the resistance value of a bipolar variable resistance device according to the invention. When the control voltage at the input Vm is greater than 0V and increasing up to about 3V, the resistance value of the resistive layer decreases. Thereafter, with the control voltage in excess of 3V, the resistance remains at about $10^9½$ because the layer has already reached saturation. When the control voltage at the input Vm is less than 0V and decreasing, the resistance of the resistive layer initially decreases correspondingly until the control voltage reaches about −3V. Thereafter the resistance remains at about $10^9½$, due again to saturation. When the control voltage is at exactly 0V, the resistance is at its peak of about $10^{11}½$.

From the description above, it can be seen that a bipolar variable resistance device designed according to the invention, can utilize a control voltage terminal to set the resistance value either higher or lower, as circumstances may demand. Its structure is simple, yet its application is broad.

Persons familiar with the technology will readily understand that the first polarity impurity dopant can be a P-type impurity, while the second polarity impurity dopant can be an N-type impurity, and that when the voltage applied to the conductive layer is varied, the resistance of the resistive layer changes similarly to that in the above described example.

While the invention has been described by way of example and terms of a preferred embodiment, it is to be understood that the invention is not limited thereto. To the contrary, it is intended to cover various modifications and similar arrangements, and the appended claims should be accorded the broadest interpretation so as to encompass all such modifications and similar arrangements.

What is claimed is:

1. A bipolar variable resistance device, comprising:

a silicon substrate;

a resistive layer covering the silicon substrate, the resistive layer being doped with a first polarity impurity and a second polarity impurity;

a dielectric layer covering the resistive layer; and a conductive layer covering the dielectric layer such that a resistance of the resistive layer changes in response to a control voltage applied to the conductive layer.

2. A device according to claim 1, wherein the thickness of the resistive layer is about 800 Å.

3. A device according to claim 1, wherein the first polarity impurity is an N-type impurity and the second polarity impurity is a P-type impurity.

4. A device according to claim 1, wherein the first polarity impurity is a P-type impurity and the second polarity impurity is an N-type impurity.

5. A device according to claim 1, wherein the dielectric layer is an oxide insulating layer.

6. A device according to claim 5, wherein the thickness of the oxide insulating layer is about 3000 Å.

7. A device according to claim 1, wherein the conductive layer is a metallic layer.

8. A device according to claim 1, wherein the conductive layer is a highly doped polysilicon layer.

9. A device according to claim 1, wherein the resistive layer is doped with the first polarity impurity at a first energy level and with the second polarity impurity at a second energy level substantially the same as the first energy level.

10. A device according to claim 1, further comprising positive and negative terminals connected to the resistive layer, the resistance of the resistive layer being defined between the positive and negative terminals.

* * * * *